(12) United States Patent
Conboy et al.

(10) Patent No.: US 7,039,495 B1
(45) Date of Patent: May 2, 2006

(54) MANAGEMENT OF MULTIPLE TYPES OF EMPTY CARRIERS IN AUTOMATED MATERIAL HANDLING SYSTEMS

(75) Inventors: Michael R. Conboy, Austin, TX (US); Patrick J. Ryan, Kyle, TX (US); Elfido Coss, Jr., Austin, TX (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/207,282

(22) Filed: Dec. 8, 1998

(Under 37 CFR 1.47)

(51) Int. Cl.
*G07F 17/00* (2006.01)

(52) U.S. Cl. ..................................... 700/213
(58) Field of Classification Search ............... 414/267, 414/940, 416, 417; 700/213, 214, 215, 216, 700/217
See application file for complete search history.

(56) References Cited

U.S. PATENT DOCUMENTS

| | | | | |
|---|---|---|---|---|
| 4,536,122 A | * | 8/1985 | Hermann et al. | 414/404 |
| 4,630,216 A | * | 12/1986 | Tyler et al. | 364/478 |
| 4,829,445 A | * | 5/1989 | Burney | 364/478 |
| 5,123,103 A | * | 6/1992 | Ohtaki et al. | 395/600 |
| 5,303,214 A | | 4/1994 | Kulakowski et al. | |
| 5,751,581 A | | 5/1998 | Tau et al. | |
| 5,838,566 A | | 11/1998 | Conboy et al. | |
| 5,944,857 A | * | 8/1999 | Edwards et al. | 29/25.01 |
| 5,957,648 A | * | 9/1999 | Bachrach | 414/217 |
| 5,963,739 A | * | 10/1999 | Homeier | 395/704 |
| 5,993,148 A | * | 11/1999 | Brown | 414/810 |
| 6,009,890 A | * | 1/2000 | Kaneko et al. | 134/133 |
| 6,050,768 A | * | 4/2000 | Iwasaki et al. | 414/222.01 |
| 6,151,533 A | * | 11/2000 | Iwasaki et al. | 700/214 |
| 6,154,876 A | * | 11/2000 | Haley et al. | 717/4 |
| 6,169,935 B1 | * | 1/2001 | Iwasaki et al. | 700/214 |
| 6,647,316 B1 | * | 11/2003 | Bahri et al. | 700/217 |

* cited by examiner

*Primary Examiner*—Donald P. Walsh
*Assistant Examiner*—Michael E. Butler

(57) ABSTRACT

Management of multiple types of empty carriers in automated material handling systems. In one embodiment, an automated material handling system (AMHS) includes a plurality of material carriers including a plurality of empty carriers classified into two or more types and one or more stock areas, each including a plurality of bins for storing material carriers. Each stock area is associated with one or more thresholds for each empty carrier type. The AMHS further includes a control system coupled to a first one of the stock areas for computing an empty percentage for each empty carrier type. The empty percentage for a particular empty carrier type is the percentage of bins of the first one stock area which contain empty carriers of the particular type. The AMHS also includes a transportation system responsive to the control system for selectively moving an empty carrier of a certain carrier type between a staging area and the first stock area based on a comparison of the empty percentage for the certain carrier type to the one or more thresholds of the first stock area for the certain carrier type.

20 Claims, 5 Drawing Sheets

MANAGEMENT OF MULTIPLE TYPES OF EMPTY CARRIERS IN AUTOMATED MATERIAL HANDLING SYSTEMS

FIELD OF THE INVENTION

The invention generally relates to automated material handling systems and, in particular, to the management of multiple types of empty carriers in automated material handling systems.

BACKGROUND OF THE INVENTION

Systems which handle material, such as manufacturing facilities, often employ automated material handling systems to move various materials from one location to another location within the system. The materials may include raw materials, finished product materials, or any materials in between. It is common to employ containers or carriers to move the materials from one location to another during the manufacturing process. Typically, a transportation system is employed, such as a conveyor belt system, for moving the carriers from one processing location to another within the system. Typically, empty containers are needed at the various process locations for holding processed materials. Likewise, empty carriers are generated as material is removed from a carrier in order to be processed. Empty containers may also be added or removed from the system.

An example of such a manufacturing facility is a facility for fabricating integrated circuits on semiconductor wafers. The facility may include a plurality of wafer fabrication process tools which perform various fabrication process steps on lots of semiconductor wafer lots. Each process tool typically has an accompanying stock area for storing carriers of wafers waiting to be processed by the tool or having already been processed by the tool. Wafer carriers may also be referred to as cassettes or "boats". The process tools need empty wafer carriers, for example, holding processed wafers after a process tool has performed a wafer fabrication operation. Conversely, as process tools remove wafers from a carrier for processing, empty carriers are generated.

Typically in an integrated circuit manufacturing facility, the requests for moves of empty carriers is very non-linear. The non-linearity is introduced, for example, by the start of the processing of many new wafer lots which suddenly creates the need for a large number of empty carriers. In addition, a situation may occur in which a process tool fails and causes a "logjam" or "bubble" in the system, thereby consuming a large number of empty carriers, and preventing empty carriers from being generated. In such a situation, empty carriers become a precious resource.

Typically, if an empty carrier is not available when needed by a process tool, for example, an empty carrier must be moved from another location in the system to fulfill the need for the empty carrier. The move of the empty carrier from the other location to the location where the empty carrier is needed imposes a time delay in the process of fabricating a wafer lot. The time delay may introduce inefficient use of the process tool needing the empty carrier. The cumulative cost of many such inefficiencies can be substantial.

One potential solution to the problem is to provide a relatively large number of empty carriers in order to minimize the delay times. This solution may be prohibitive both in terms of storage costs and carrier costs. Therefore, an improved method for managing empty carriers in an automated material handling system is desired which reduces cost by reducing the number of empty carriers required, reducing the number of carrier moves in the system, reducing the number and/or size of stock areas, and improving the production efficiency of the system.

SUMMARY OF THE INVENTION

The present invention generally relates to the management of multiple types of empty carriers in automated material handling systems. In one embodiment, an automated material handling system (AMHS) is provided. The AMHS includes a plurality of material carriers including a plurality of empty carriers classified into two or more types and one or more stock areas, each including a plurality of bins for storing material carriers. Each stock area is associated with one or more thresholds for each empty carrier type. The AMHS further includes a control system coupled to a first one of the stock areas for computing an empty percentage for each empty carrier type. The empty percentage for a particular empty carrier type is the percentage of bins of the first one stock area which contain empty carriers of the particular type. The AMHS also includes a transportation system responsive to the control system for selectively moving an empty carrier of a certain carrier type between a staging area and the first stock area based on a comparison of the empty percentage for the certain carrier type to the one or more thresholds of the first stock area for the certain carrier type.

In another embodiment, there is provided a method for managing empty material carriers and an AMHS which includes a plurality of empty material carriers and a plurality of stock areas, each of which includes bins for storing material carriers. This method includes classifying the empty material carriers into two or more empty carrier types, associating each of the stock areas with one or more thresholds for each empty carrier type, computing an empty percentage for each empty carrier type for a first one of the stock areas, and selectively moving an empty carrier of a certain carrier type between a staging area and the first stock area based on a comparison of the empty percentage for the certain carrier type for the first stock area to the one or more thresholds of the first stock area for the certain carrier type. The empty percentage for a particular empty carrier type may be the percentage of bins of the first one stock area which contain empty carriers of the particular type.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
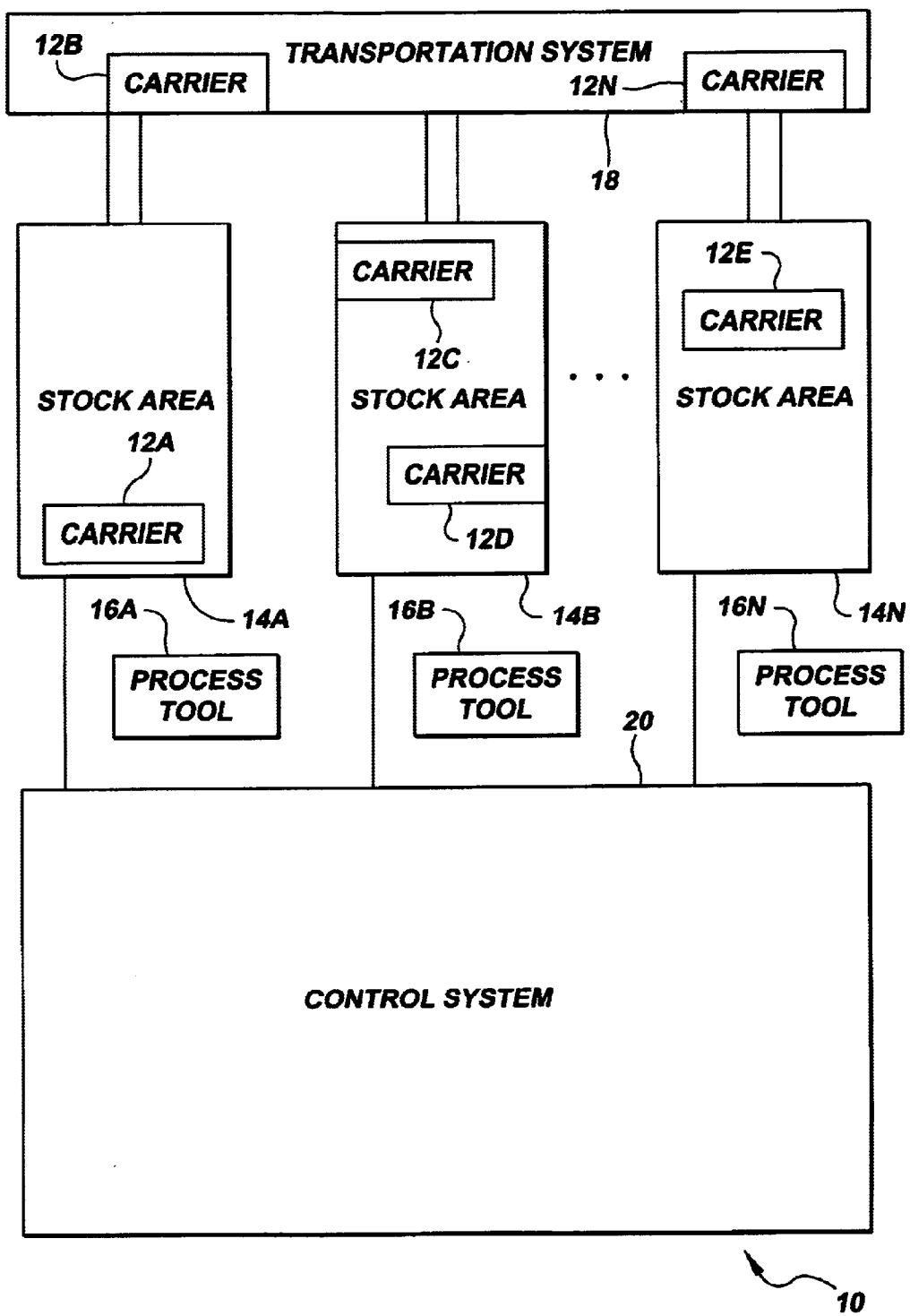
FIG. 1 is a block diagram of an exemplary automated wafer carrier handling system in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims:

DETAILED DESCRIPTION

The present invention generally provides techniques for managing the movement of multiple types of empty carriers in an automated material handling system, such as a semiconductor wafer carrier handling system. While the present invention is not so limited, a better understanding of the invention will be found by reading the detailed description and exemplary embodiments which follow.

Referring now to FIG. 1, a block diagram of an exemplary automated semiconductor wafer handling system 10 is shown. System 10 includes a plurality of wafer carriers 12A through 12N (referred to collectively as 12), a plurality of stock areas 14A through 14N (referred to collectively as 14), and a transportation system 18 which moves the carriers 12 between the stock areas 14 subject to the control of a control system 20, so that semiconductor wafers inside the carriers 12 may be processed by process tools 16A through 16N (referred to collectively as 16) associated with the stock areas 14.

For clarity, a representative wafer carrier will be referred to henceforth as 12A. The carriers 12 are configured to carry semiconductor wafers to various locations within the system 10. At any given point in time, a given carrier 12A may contain wafers or may be empty. In one embodiment, a carrier 12A is configured to carry up to twenty four semiconductor wafers at a time. The set of wafers contained in the carrier 12A will herein be referred to as a wafer lot or lot. In one embodiment, the carrier 12A includes a bar code label affixed on the outside of the carrier 12A which uniquely identifies the carrier 12A from the other carriers 12 in the system 10.

The carriers 12 are classified into two or more types typically based on attributes of the carriers. The number of carrier attributes and thus the number of carrier types can vary depending on the type of AMHS employed as well as the desired level of classification. The wafer carriers may have an attribute designating whether the wafer carrier is used in front-end-of-line (FEOL) processing or back-end-of-line (BEOL) processing. The dividing line between FEOL processes and BEOL processes is typically a first metal deposition step. A carrier may also have one or more attributes indicating whether or not the carrier has been exposed to a particular contaminant, such as copper or cobalt. The carrier may also have an attribute indicating whether the carrier is clean or dirty and/or an attribute indicating whether the carrier is used for holding test lots or product lots.

It should be appreciated that these attributes are exemplary only and may or may not be used in a given environment. Other and/or additional attributes may also be provided to classify the wafer carriers. In addition, the attributes of a carrier may change depending on the wafers held by a carrier during its use. A more detailed discussion of attribute handling may be found in U.S. patent application Ser. No. 09/193,349, entitled "Managing A Semiconductor Fabrication Facility Using Wafer Lot And Cassette Attributes", filed on Nov. 17, 1998, now U.S. Pat. No. 6,449,552, the contents of which are herein incorporated by reference.

The number of types of wafer carriers thus typically depends on the number of attributes used to classify the carriers. For example, if each carrier includes an attribute designating the carrier as an FEOL or BEOL type carrier and one attribute designating the carrier as a test lot type carrier or a product lot type carrier, the carriers will be classified into four different types: (1) an FEOL product lot type, (2) an FEOL test lot type, (3) a BEOL product lot type, and (4) a BEOL test lot type. As will be appreciated from the discussion which follows, a control system may advantageously manage the movement of empty carriers based on the type of the empty carrier.

Each carrier type may also be associated with a priority parameter which indicates the move priority of the carrier type relative to other carrier types. The priority of a carrier type may be used to facilitate movement of empty carriers within move system 10.

The system 10 further includes a plurality of stock areas 14 and an associated plurality of process tools 16. For clarity, a representative stock area will be referred to henceforth as 14A and a representative process tool as 16A. Each of the stock areas 14 include a plurality of bins. Each of the bins is configured to store a wafer carrier 12A. Typically, the bins of a stock area 14A can store empty carriers as well as non-empty carriers, i.e., carriers containing wafers waiting to be processed by an associated process tool or waiting to be sent to another location within the system 10.

The stock area 14A typically includes input ports for receiving a carrier 12A. The stock area 14A receives the carrier 12A via its input ports from the transportation system 18. In one embodiment, the stock area 14A receives the carrier 12A via its input ports from a wafer technician. The wafer technician provides the carrier 12A to the stock area 14A typically after receiving the carrier 12A from a process tool 16A after the process tool 16A has performed process operations on the wafers in the carrier 12A. In another embodiment, the transfers of the carrier 12A to the stock area 14A from the process tool 16A are performed automatically. The stock area 14A receives the carrier 12A from an input port and stores the carrier 12A in one of the bins of the stock area 14A.

The stock area 14A typically includes output ports for dispensing a carrier 12A. The stock area 14A dispenses the carrier 12A via its output ports to a transportation system 18. In one embodiment, the stock area 14A dispenses the carrier 12A via its output ports to a wafer technician. The wafer technician receives the carrier 12A and provides the carrier 12A to a process tool 16A for the process tool 16A to perform process operations on the wafers in the carrier 12A. In another embodiment, the transfers of the carrier 12A from the stock area 14A to the process tool 16A are performed automatically. The stock area 14A removes the carrier 12A from one of its bins and dispenses the carrier 12A to an output port.

In one embodiment, the stock area 14A also includes a bar code reader at each of the input and output ports for reading the bar code on the carrier 12A as the carrier 12A is received or dispensed by the stock area 14A. In one embodiment, the stock area 14A includes a wafer presence sensor which senses the presence of wafers inside the carrier 12A, e.g., to confirm whether or not the carrier 12A is empty. The bar code and optionally the wafer presence information is typically included in a message sent by the stock area 14A to the control system 20 when a carrier 12A is received or dispensed by the stock area 14A.

In one embodiment, the stock area 14A includes a serial interface port, such as an RS-232 port, for communicating with a control system 20. In one embodiment, the stock area 14A communicates with the control system 20 over the serial port by exchanging messages. The messages include event information which the stock area 14A sends to the control system 20 to notify the control system 20 of events such as receiving, dispensing, storing or removing the carrier 12A. The messages also include command, or control information which the control system 20 sends to the stock area 14A to control the stock area 14A to perform an action such as dispensing, storing or removing the carrier 12A.

At any given point in time, some percentage of the bins in the stock area 14A contain empty carriers. The empty percentage for a given carrier type may range from zero percent, i.e., no empty carriers of the given type, to one hundred percent, i.e., all empty carriers of the given type.

Thus, the stock areas 14 act as staging areas for the wafers as the wafers are processed by the process tool 16A. The process tool 16A may also act as a stock area, wherein the carrier 12A is moved by the transportation system 18 directly from one process tool to another within the system 10. Embodiments are contemplated in which a process tool has more than one associated stock area and in which more than one process tool shares a given stock area. A stock area is intended to include any location in which a plurality of material carriers may be placed or stored. A stock area is further intended to include any location in which the material is processed.

Each of the stock areas 14 is typically associated with one or more empty percentage thresholds for each type of carrier. The one or more thresholds for a given stock area 14A typically include a maximum value indicating the maximum desired percentage of bins holding empty carriers of a certain carrier type and a minimum value indicating the minimum desired percentage of bins holding empty carriers of a certain carrier type. The maximum and minimum values for a given stock area 14A may range from zero percent (0%) to one hundred percent (100%) depending on the desired percentage of empty carriers of a particular type in the given stocker area 14A. Where a maximum value is set to 0%, the control system 20 attempts to store no empty carriers of the particular type in the stock area 14A. On the other hand, where a minimum value is set to 100%, control system 20 attempts to stock the given stocker area 14A with only empty carriers of the particular type.

The maximum and minimum values for a particular carrier type can vary from stock area to stock area depending on, for example, the location of stock area. For example, stock areas associated with FEOL processing tools or areas may have higher maximum and minimum values for FEOL empty carrier types. Similarly, stock areas located near copper deposition tools may have higher maximum and minimum values for copper empty carrier types.

The system 10 further includes a transportation system 18 for moving the carriers 12 between the stock areas 14, and thus between the tools 16. The transportation system 18 also moves the carriers 12 into and out of the system 10 as necessary. In one embodiment, the transportation system 18 includes one or more monorail systems which transport the carriers 12 within, into, and out of the system. Each monorail system typically includes "cars" which transport a carrier 12A along the monorail.

The stock area 14A dispenses the carrier 12A out an output port to a monorail car, the monorail car transports the carrier 12A down the rail, and another stock area 14B receives the carrier 12A in an input port from the monorail car. Thus a move of a carrier 12A within the system 10 is performed from one stock area 14A to another. The transportation system 18 may include any transportation system suitable for moving the material carriers 12 between the stock areas 14 of the system 10.

The system 10 further includes a control system 20 configured to control the movement of empty carriers 12 between the stock areas 14 within the system 10. The control system 20 is coupled to the stock areas 14 and receives event information from the stock areas 14 and provides control information to the stock areas 14 for controlling empty carrier movement.

Figure 2:
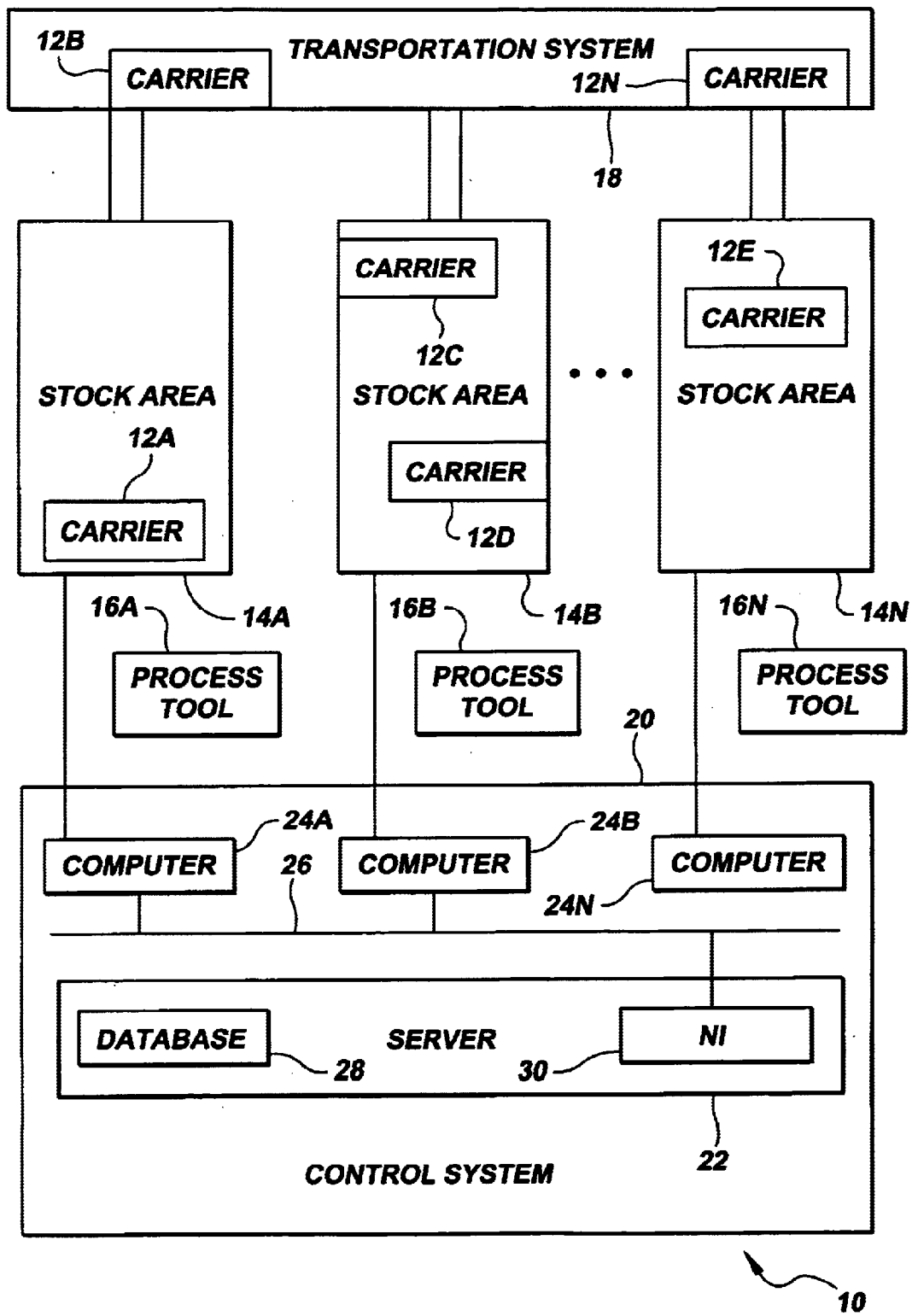
FIG. 2 is a block diagram illustrating an exemplary control system in accordance with an embodiment of the invention.

Referring now to FIG. 2, details of an exemplary control system 20 will be discussed. The control system 20 typically includes a local area network (LAN) which includes a plurality of computers 24A through 24N (referred collectively as 24), each coupled to an associated one of the stock areas 14. For clarity, a representative computer will be referred to henceforth as 24A.

The computers 24 are typically coupled to a server 22 via a network. The computer 24A and server 22 typically include elements common to general purpose computers such as a mouse, a keyboard, system memory, permanent storage such as a hard drive, a video display, and network interface device. In one embodiment, the computers 24 and server 22 may communicate with each other over the network 22 via the TCP/IP protocol. The server 22 typically includes a network interface 30 which routes network packets between the computers 24 and the server 22 on the network 26. In one embodiment, the computers 24 and server 22 execute a distributed software application which controls the stock areas 14 in order to manage the movement of the carriers 12.

The server 22 typically maintains a database 28 of information relevant to the management of empty carriers in the system 10. In one embodiment, the database 28 is a relational database. The database 28 typically contains an inventory of information about each bin in each of the stock areas 14, such as whether or not each bin is empty or populated, and if populated by which of the carriers 12. The database 28 typically also contains an inventory of information about each of the carriers 12 in the system 10. The database 28 may contain the type of each of the carriers 12 (e.g., the attributes of each of the carriers 12). The database 28 may also contain a priority parameter for each carrier type designating the move priority of the carrier type. The database 28 may also contain the location and lot information of each of the carriers 12. The lot information typically includes whether or not the carriers are empty. The database 28 may also maintain information regarding the move history of the carriers 12 in the system 10, such as source and destination locations, carrier ID, and time associated with each move in the system 10. The database 28 is typically maintained based on the event information received by the computers 24 which is forwarded to the server 22.

In one embodiment, the computer 24A includes a serial interface port, such as an RS-232 port, for communicating with its associated stock area 14A. Control system 20 preferably communicates with the stock area 14A over the serial port by exchanging messages. The messages include event information which the stock area 14A sends to the control system 20 to notify the control system 20 of events such as receiving, dispensing, storing or removing the carrier 12A. The messages also include command, or control information which the control system 20 sends to the stock area 14A to control the stock area 14A to perform an action such as dispensing, storing or removing the carrier 12A. The messages are used to control the movement of the carriers 12, including empty carriers, in the system 10.

The control system 20 maintains control parameters related to the management of empty carriers within the system 10. The control parameters may include the minimum and maximum empty percentage threshold for each carrier type; a maximum system move rate threshold; a maximum global empty move rate threshold; a system move time period; a empty move time period and individual empty move rate thresholds for each carrier type. The control parameters are typically set by an operator of the system 10 and are typically capable of being changed during operation.

The control parameters may be stored in the control system 20 in a number of different manners. For example, the control parameters may all be stored in a common memory arrangement. The common memory arrangement may for example, reside on one of the computers 24, be distributed over a number of the computers 24 or may reside on a separate computer connected to the network. Alternatively, each of the computers 24A may store all of the control parameters or simply the control parameters needed for carrying out calculations for an associated stock area 14A. In the latter case, a computer 24A may, for example, store the maximum and minimum thresholds for each carrier type for each of its associated stock area and optionally individual maximum move rate thresholds for each carrier type, a global maximum empty move rate threshold, a maximum system move rate threshold, and the empty and system move time periods. The above examples of parameter storing are not exhaustive. The invention is not limited to any particular storage arrangement.

Figure 3:
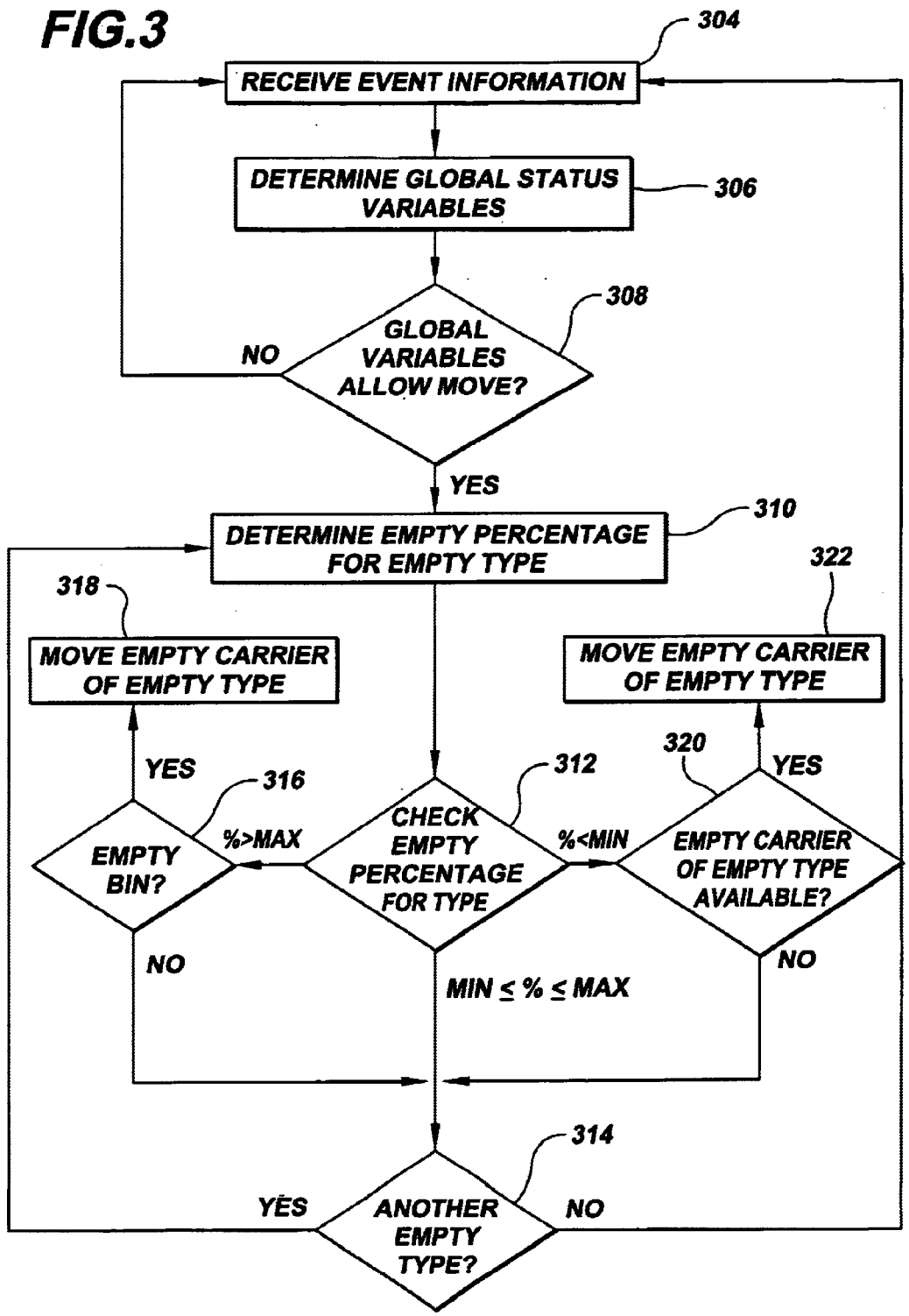
FIG. 3 is a flow chart illustrating an exemplary process for managing multiple types of empty carriers in accordance with another embodiment of the invention.

Referring now to FIG. 3, a flowchart illustrating an exemplary process for managing multiple types of empty carriers is shown. While this example process will be described with reference to a particular stock area 14A, the control system 20 may perform a similar process for each of the stock areas 14. Typically, this example process is performed by the computer 24A of the control system 20 associated with the each stock area 14A. However, in distributed environments, such as the illustrated embodiment, any computer in the network may perform the process for a stock area 14A.

The control system 20 waits for an event to occur and receives the event as indicated at block 304. In one embodiment, the events which the control system 20 receives are a timer tick and/or events from the stock areas 14. The timer tick may be used to perform the movement of empty carriers on a periodic basis. The time period of the timer may be set by an operator of the system 10 and may be maintained by a computer 24A, for example. Exemplary events from the stock areas 14 include a stock area 14A having received a carrier 12A at an input port, the stock area 14A having provided a carrier 12A to an output port, the stock area 14A having placed the carrier 12A in a bin, and the stock area 14A having removed the carrier 12A from a bin. Typically, the stock area 14A notifies its associated computer 24A of an event by sending a message over the serial interface. Typically, the message includes the bar code information from the carrier 12A and the wafer presence information, i.e., whether or not the carrier 12A is empty, and the bin number.

In one embodiment, the computer 24A provides the event information to the server 22, and the server 22 updates the database 28 in response to the event information. In particular, the server 22 typically updates the carrier and bin inventory information, as well as the move history information.

Once an event has been received, the control system 20 calculates global status variables, as indicated at block 306. The global status variables may be calculated in response to an event received by the control system 20. The global status variables may include: the system move rate, i.e., the number of carriers moved within the system 10 over a period of time referred to as the system move period; and the global empty move rate, i.e., the total number of empty carriers of all types moved within the system 10 over a period of time referred to as the empty move period.

Calculating the system move rate typically includes retrieving the system move time period, querying the database 28 for the number of moves for all carriers (empties and non-empties) in the system 10 in the past amount of time specified by the system move period, and dividing the number of carrier moves by the system move period of time. Calculating the global empty move rate typically includes retrieving the empty move time period, querying the database 28 for the number of moves for all empty carriers in the system 10 in the past amount of time specified by the empty move period, and dividing the number of empty carrier moves by the empty move period of time.

Once the global status variables have been calculated, the control system determines whether the global status variables allow an empty carrier move, as indicated at block 308. This typically includes determining if the system move rate of the system 10 is greater than the maximum system move rate threshold and/or determining if the global empty move rate of the system 10 is greater than the maximum empty move rate threshold. If the system move rate exceeds the maximum system move rate threshold or if the global empty move rate exceeds the maximum global empty move rate threshold, the control system 20 defers moving an empty carrier of any type and proceeds to block 304 to wait for another event.

The maximum system move rate threshold is typically based on the design of the system 10, such as the physical limitations of the system 10 like the size and speed of the transportation system 18, the number of stock areas 14, the number of interfaces, response time of the control system 20, and the level of safety constraints. Typically, the maximum system move rate parameter is set to a value to prevent a spike of carrier movement, which may cause inefficiencies in the flow of carrier traffic on the transportation system 18. Typically, maximum system move rate threshold is set to a value to prevent attempting to move empty carriers 12 in the system 10 beyond its capabilities which may cause failures within the system such as collisions of carriers or gridlock situations.

The maximum global empty move rate threshold serves as a damping factor so that the movement of empty carriers does not cause instability of the system 10. For example, an operator of the system 10 may be aware of a change in the work flow of the system about to occur, such as the start of a set of new wafer lots, and in response introduces a large number of empty carriers into the system 10 at a strategic point in the system 10, such as at a crucial stock area 14A. The global empty move rate threshold helps to prevent overreaction of the empty management control system to the introduction of new empty carriers which might cause instability in the system 10.

If the system move rate and global empty move rate fall below their respective thresholds, control moves to block 310, where the control system 20 determines the empty percentage for a particular carrier type for stock area 14A. Calculating the empty percentage for a particular carrier type for a given stock area 14A typically includes querying the database 28 for the number of empty carriers of the particular type in the stock area 14A, querying the database 28 for the number of bins which the stock area 14A has, and dividing the number of empty carriers of the particular type by the number of bins.

The control system 20 compares the empty percentage for the particular carrier type against either or both empty percentage thresholds for the stock area 14A for the particular type and reacts accordingly, as indicated at block 312. The values of the maximum and minimum empty percentage thresholds for a particular carrier type and stock area are typically chosen to avoid or reduce time delays due to unavailability of particular types of empty carriers. Thus, the minimum and maximum empty percentage thresholds advantageously provide a range in which the control system 20 attempts to keep the empty percentage of each carrier type in the stock areas 14 in order to reduce or eliminate time delays introduced by the unavailability of certain carrier types of empty carriers. This can, for example, reduce cost by reducing the number of empty carriers required, reducing the number of carrier moves in the system, reducing the number and/or size of stock areas, and improving the production efficiency of the system.

If the empty percentage for the particular carrier type of the stock area 14A falls between the minimum and maximum empty percentage control parameters for the particular type of carrier for the particular stock area 14A, control moves to block 314 where the control system 20 checks to see if the stock area 14A includes empty carriers of other types which need to be considered for moves. If no other empty carrier types remain to be checked, control moves to block 304 where the control system 20 waits for the next event. Otherwise, control moves to block 310 and the system 20 loops through blocks 310–322 for another carrier type.

If the empty percentage for the particular carrier type for the stock area 14A is greater than the stock area's maximum empty percentage threshold for the particular carrier type, the control system 20 determines if an empty bin is available in one of the other stock areas 14, as indicated at block 316. Typically, this includes the control system 20 querying the database 28 about the availability of an empty bin in the stock areas 14. If no empty bins are available in the other stock areas 14, the control system 20 defers attempting to bring the empty percentage for the particular carrier type for the stock area 14A below the respective maximum empty percentage threshold of the stock area 14A for the particular carrier type until the next event and proceeds to block 314 to check to see if empty carriers of other types need to be considered for moves.

If an empty bin is available in one of the other stock areas 14, the control system 20 controls the movement of an empty carrier of the particular type from the stock area 14A to the stock area having an empty bin, as indicated at block 318. The control system 20 may move the empty carrier of the particular type out of the stock area 14A based on a priority of the particular carrier type relative to priorities of other carrier types. For example, production lot type empty carriers may be moved at a higher priority than test lot type empty carriers. A more detailed description of empty carrier movement will be discussed below.

In one embodiment, the control system 20 selects one of the other stock areas 14 to move the empty carrier to based upon the empty percentages for the particular carrier type of the other stock areas 14. In one embodiment, the control system 20 does not move an empty carrier to another stock area whose empty percentage for the particular carrier type already exceeds its respective maximum empty percentage threshold. In one embodiment, the control system 20 moves the empty carrier to another stock area which has the smallest number or percentage of empty bins. In another embodiment, the control system 20 moves the empty carrier to another stock area which has the smallest percentage of empty carriers of the particular type. If the empty percentage for the particular type for the stock area 14A is less than the stock area's minimum empty percentage threshold for the particular carrier type, the control system 20 determines if an empty carrier of the particular type is available in one of the other stock areas 14, as indicated at block 320. Typically, this includes the control system 20 querying the database 28 about the availability of an empty carrier of the particular type in the other stock areas 14. If no empty carriers of the requisite type are available in the other stock areas 14, the control system 20 defers attempting to bring the empty percentage for the particular carrier type for the stock area 14A above the minimum empty percentage threshold of the stock area 14A for the particular carrier type until the next event and proceeds to block 314 to check to see if empty carriers of other types need to be considered for moves.

If an empty carrier of the requisite type is available in one of the other stock areas 14, the control system 20 typically controls the movement of an empty carrier of the requisite type from the source stock area having the empty carrier of the requisite type to the stock area 14A, as indicated at block 322. The control system 20 may move the empty carrier of the particular type to the stock area 14A based on a priority of the particular carrier type relative to priorities of other carrier types, as noted above. A more detailed description of empty carrier movement will be discussed below. In one embodiment, the control system 20 selects one of the other stock areas 14 for providing the empty carrier of the particular type based upon the empty percentages for the particular carrier type of the other stock areas 14. In one embodiment, the control system 20 does not move an empty carrier of the particular type from another stock area whose empty percentage for the particular carrier type is already below its respective minimum empty percentage threshold. In one embodiment, the control system 20 moves the empty carrier from another stock area which has the greatest number or percentage of empty bins. In another embodiment, the control system 20 moves the empty carrier from another stock area which has the largest percentage of empty carriers of the particular type.

Figure 4:
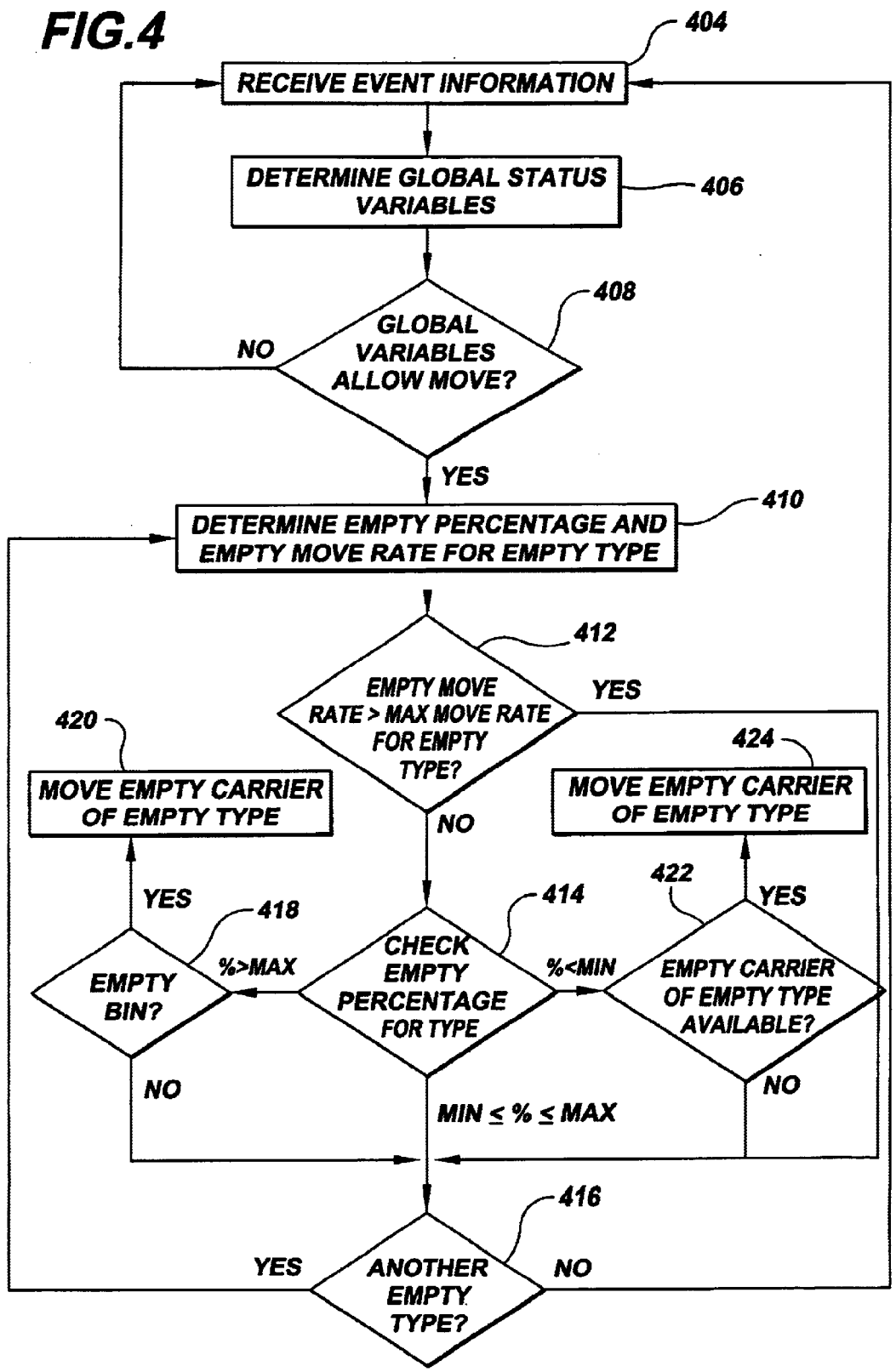
FIG. 4 is a flow chart illustrating an exemplary process of managing multiple types of empty carriers in accordance with yet another embodiment of the invention.

FIG. 4 illustrates another exemplary process for managing the movement of multiple types of empty carriers. This example process will also be described with reference to a particular stock area 14A. Again, it is noted that the control system 20 (e.g., computer 24A) may perform a similar process for each of the stock areas 14. At block 404, the control system 20 waits for an event to occur and receives the event in a similar manner as discussed above.

Once an event has been received, the control system 20 calculates global status variables, as indicated at block 406. Calculating the global status variables may include calculating the global status variables in response to an event received by the control system 20. The global status variables may include the system move rate, i.e., the number of carriers moved within the system 10 over a period of time referred to as the system move period. The system move rate may be calculated in the manner discussed above. The control system 20 may optionally compute a global empty move rate as discussed above.

Once the global status variables have been calculated, the control system determines whether the global status variables allow an empty carrier move, as indicated at block 408. This typically includes determining if the system move rate of the system 10 is greater than the maximum system move rate threshold. If so, the control system 20 defers moving an empty carrier and proceeds to block 404 to wait for another event. Otherwise, control moves to block 410 where the control system 20 determines the empty percentage and empty move rate for a particular carrier type for the stock area 14A. Optionally, the global empty rate may be compared to its threshold to determine if the global variables allow a move, as discussed above.

The empty percentage for the particular carrier type may be determined in the manner discussed above. Calculating the empty move rate for the particular carrier type typically includes retrieving the empty move time period, querying the database 28 for the number of moves for empty carriers of the particular type in the system 10 in the past amount of time specified by the empty move period, and dividing the number of empty carrier moves by the empty move period of time.

The control system 20 determines whether the empty move rate for the particular carrier type exceeds a maximum allowable empty move rate threshold for the particular carrier type, as indicated at block 412. If so, control moves to block 416 where the control system 20 checks to see if the stock area 14A includes empty carriers of other types which need to be considered for moves. If no other empty carrier types remain to be checked, control moves to block 404 where the control system 20 waits for the next event. Otherwise, control moves to block 410 and the control system 20 loops through blocks 410–424 for another carrier type.

The individual maximum empty move rate threshold for a particular carrier type allows for different types of empty carriers to be moved at different rates. This provides one way in which the movement of empty types may be prioritized. This threshold can also serve as a low-level damping factor so that the movement of empty carriers of a particular type do not cause instability of the system 10. For example, an operator of the system 10 may be aware of a change in the work flow of the system about to occur, such as the start of a set of new test wafer lots, and in response introduces a large number of test lot type empty carriers into the system 10 at a strategic point in the system 10, such as at a crucial stock area 14A. The empty move rate threshold associated with test lot type carriers can thus help to prevent overreaction of the control system to the introduction of the new empty carriers of a particular type which might cause instability in the system 10.

If the empty move rate for the particular carrier type is less than the maximum empty move rate threshold for the particular carrier type, the control system checks the empty percentage for the particular type against one or both empty percentage thresholds for the stock area 14A for the particular type and reacts accordingly, as indicated at block 414. The values of the maximum and minimum empty percentage thresholds for a particular carrier type and stock area may be selected the manner discussed above.

If the empty percentage for the particular carrier type of the stock area 14A falls between the minimum and maximum empty percentage thresholds for the particular type of carrier and particular stock area 14A, control moves to block 416 the control system 20 checks to see if the stock area 14A includes empty carriers of other types which need to be considered for moves and reacts accordingly.

If the empty percentage for the particular type for the stock area 14A is greater than the stock area's maximum empty percentage threshold for the particular carrier type, the control system 20 determines if an empty bin is available in one of the other stock areas 14, as indicated at block 418. If no empty bins are available in the other stock areas 14, the control system 20 defers attempting to bring the empty percentage for the particular carrier type for the stock area 14A below the respective maximum empty percentage threshold of the stock area 14A for the particular carrier type until the next event and proceeds to block 416 to check to see if empty carriers of other types need to be considered for moves. If an empty bin is available in one of the other stock areas 14, the control system 20 controls the movement of an empty carrier of the particular type from the stock area 14A to the destination stock area having an empty bin, as indicated at block 420. This may be done in a similar manner as discussed above.

If the empty percentage for the particular type for the stock area 14A is less than the stock area's minimum empty percentage threshold for the particular carrier type, the control system 20 determines if an empty carrier of the particular type is available in one of the other stock areas 14, as indicated at block 422. If no empty carriers of the requisite type are available in the other stock areas 14, the control system defers attempting to bring the empty percentage for the particular carrier type for the stock area 14A above the minimum empty percentage threshold of the stock area 14A for the particular carrier type until the next event and proceeds to block 416 to check to see if empty carriers of other types need to be considered for moves. If an empty carrier of the requisite type is available in one of the other stock areas 14, the control system 20 typically controls the movement of an empty carrier of the requisite type from the source stock area having the empty carrier of the requisite type to the stock area 14A, as indicated at block 424. This may be done in a similar manner as discussed above.

Figure 5:
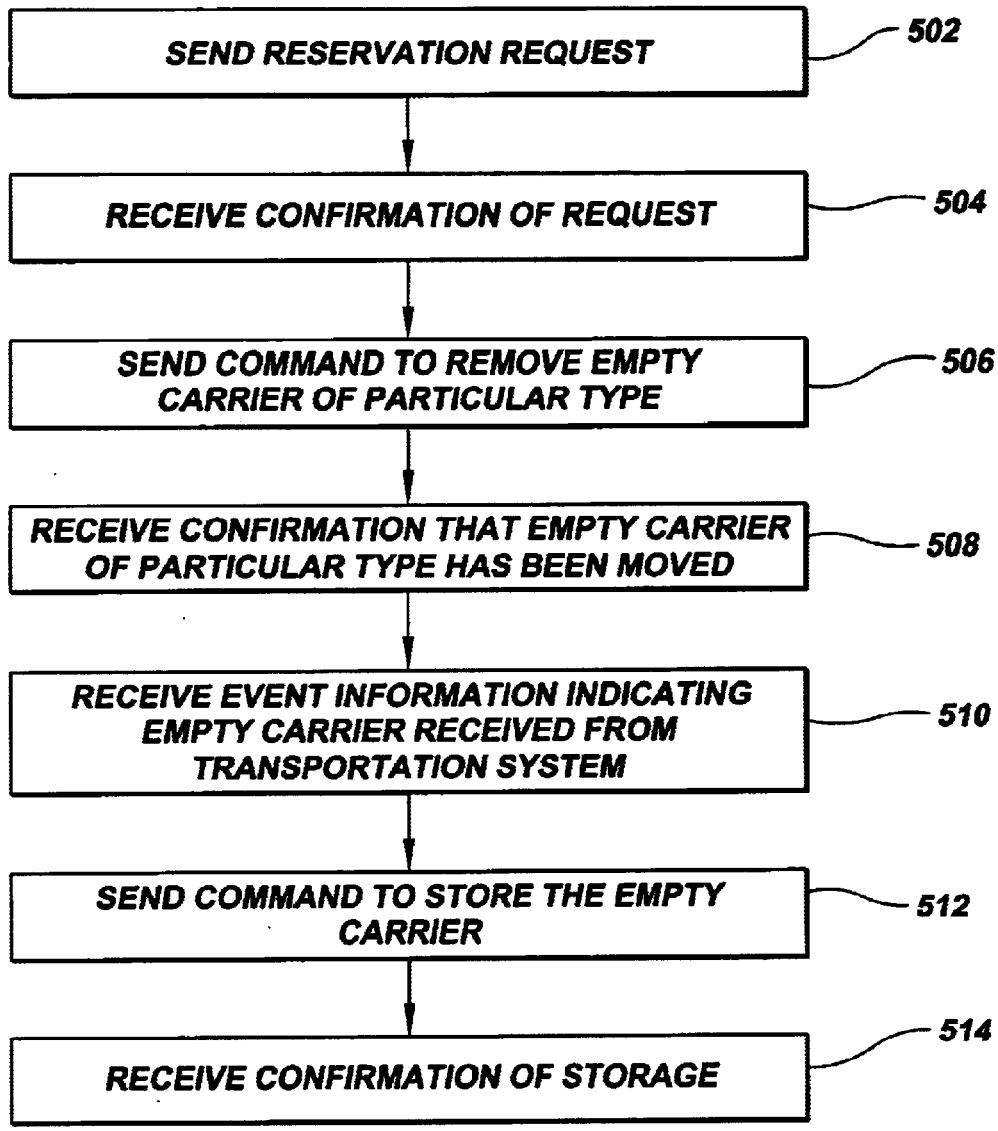
FIG. 5 is a flow chart illustrating an exemplary process for controlling the movement of an empty carrier in accordance with still another embodiment of the invention.

FIG. 5 is a flowchart illustrating an exemplary process for controlling the movement of an empty carrier of a particular type. The control system 20 determines the source stock area 24A and destination stock area 24B of the move. The source stock area 24A may be a stock area with too many empty carriers of the particular type and the destination stock area 24B may be the stock area which receives an empty carrier of the particular type. Alternatively, the destination stock area 24B may be a stock area with too few empty carriers of a particular type and the source stock area 24A may be a stock area which gives up an empty carrier of the particular type.

The source computer 24A typically queries the database 28 to obtain the carrier ID of the empty carrier of the particular type (hereinafter simply "the empty carrier") and the bin number of the bin in which the empty carrier is currently stored. The source computer 24A sends a reservation request to the destination computer 24B coupled to the destination stock area 24B to reserve a bin in the destination stock area 24B, as indicated at block 502. The empty carrier ID may be sent with the reservation request so that the destination computer 24B can confirm the reception of the empty carrier later. When the source computer 24A receives a confirmation of the reservation from the destination computer 24B, at block 504, the source computer 24A typically sends a command to the source stock area 24A to remove the empty carrier from the specified bin and to dispense the particular empty carrier to an output port onto the transportation system 18, as indicated at block 506.

The source computer 24A typically provides the empty carrier ID and bin number to the source stock area 24A in the command. When the source stock area 24A performs the removal and dispensing of the empty carrier, the source stock area 24A typically reads the bar code label on the empty carrier and confirms a match with the carrier ID specified in the command. The command may also indicate that the empty carrier is empty and a wafer presence sensor of the source stock area 24A confirms that the carrier is empty. If the carrier is not empty, an error condition is reported. The source computer 24A later receives a confirmation from the source stock area 24A that the carrier has been removed and dispensed, as indicated at block 508.

The empty carrier travels along the transportation system 18 from the source stock area 24A to the destination stock area 24B. The destination computer 24B typically receives an event message from the destination stock area 24B indicating the arrival and reception of the empty carrier, as indicated at block 510. The destination stock area 24B typically reads the bar code label of the empty carrier and may also perform a wafer presence check on the empty carrier. The destination computer 24B then typically sends a command message to the destination stock area 24B to store the empty carrier in the empty bin in the destination stock area 24B for which a reservation was made, as indicated at block 512. The destination computer 24B typically later receives an event message from the destination stock area 24B confirming that the empty carrier has been stored in the specified bin, as indicated at block 514. In one embodiment, the communication between the source computer 24A and destination computer 24B is accomplished via the server 22.

As noted above, the present invention is applicable to a number of different automated material handling systems which could benefit from management of empty carriers of multiple types. Accordingly, the present invention should not be considered limited to the particular examples described above, but rather should be understood to cover all aspects of the invention as fairly set out in the attached claims. For example, a control system may omit checking global variable and simply control movement of empty carriers based on the empty percentages and/or empty move rate of a particular carrier type. Various modifications, equivalent processes, as well as numerous systems to which the present invention may be applicable will be readily apparent to those of skill in the art to which the present invention is directed upon review of the present specification. The claims are intended to cover such modifications and systems.

We claim:

1. An automated material handling system, comprising:
   a plurality of material carriers including a plurality of empty carriers classified into at least two empty carrier types;
   at least one stock area, each including a plurality of bins for storing material carriers, wherein each stock area is associated with at least one threshold for each empty carrier type;
   a control system coupled to a first one of the stock areas for computing an empty percentage for the first stock area for each empty carrier type, the empty percentage for a particular carrier type being the percentage of bins of the first one stock area which contain empty carriers of the particular type; and
   a transportation system responsive to the control system for selectively moving an empty carrier of a certain empty carrier type between a staging area and the first stock area based on a comparison of the empty percentage for the certain carrier type to the at least one threshold of the first stock area for the certain empty carrier type.

2. The automated material handling system as recited in claim 1, wherein the material carriers include semiconductor wafer carriers.

3. The automated material handling system as recited in claim 1, wherein the at least one threshold for the empty carrier of the certain carrier type includes a maximum value and wherein the transportation system moves an empty carrier of the certain carrier type from the first stock area to the staging area if the maximum value is exceeded by the empty percentage of the certain carrier type.

4. The automated material handling system as recited in claim 1, wherein the at least one threshold for the empty carrier of the certain carrier type includes a minimum value and wherein the transportation system moves an empty carrier of the certain carrier type to the first stock area from the staging area if the empty percentage of the certain carrier type falls below the minimum value.

5. The automated material handling system as recited in claim 1, wherein the staging area includes a second one of the stock areas.

6. The automated material handling system as recited in claim 1, wherein the control system calculates a system move rate as the number of the plurality of material carriers moved by said transportation system in a predetermined time period and the transportation system moves the empty carrier of the certain carrier type between the staging area and the first stock area only if the system move rate is less than a predetermined value.

7. The automated material handling system as recited in claim 1, wherein each empty carrier type is associated with a priority and wherein the transportation system moves the empty carrier of the certain carrier type between the first stock areas and the staging area based on the priority of the certain carrier type and the priorities of other carrier types.

8. The automated material handling system as recited in claim 1, wherein the control system calculates an empty move rate for the certain carrier type as the number of empty carriers of the certain carrier type moved by the transportation system in a predetermined time period and the transportation system moves the empty carrier of the certain carrier type between the staging area and the first stock area only if the empty move rate for the certain carrier type is less than a predetermined value.

9. The automated material handling system as recited in claim 1, wherein the control system calculates a global empty move rate as the number of all empty carriers moved by the transportation system in a predetermined time period, and the transportation system moves the empty carrier of the certain carrier type between the staging area and the first stock area only if the global empty move rate is less than a predetermined value.

10. A method for managing empty material carriers in an automated material handling system including a plurality of material carriers including empty material carriers and at least one stock area each including bins for storing material carriers, the method comprising:
   classifying at least the empty material carriers into at least two empty carrier types;
   associating each of the stock areas with at least one threshold for each carrier type;
   computing an empty percentage for each empty carrier type for a first one of the stock areas, the empty percentage for a particular empty carrier type being the percentage of bins of the first one stock area which contain empty carriers of the particular type; and selectively moving an empty carrier of a certain empty carrier type between a staging area and the first stock area based on a comparison of the empty percentage for the certain carrier type for the first stock area to the at least one threshold of the first stock area.

11. The method of claim 10, wherein the material carriers include semiconductor wafer carriers.

12. The method of claim 10, wherein the at least one threshold for the empty carrier of the certain carrier type includes a maximum value and wherein selectively moving the empty carrier of the certain carrier type from the first stock area to the staging area includes moving the empty carrier of the certain carrier type if the maximum value is exceeded by the empty percentage of the certain carrier type.

13. The method of claim 10, wherein the at least one threshold for the empty carrier of the certain carrier type includes a minimum value and wherein selectively moving the empty carrier of the certain carrier type to the first stock area from the staging area includes moving the empty carrier of the certain carrier type if the empty percentage of the certain carrier type falls below the minimum value.

14. The method of claim 10, wherein the staging area includes a second one of the stock areas.

15. The method of claim 10, further including calculating a system move rate as the number of the plurality of material carriers moved in the system in a predetermined time period, wherein selectively moving the empty carrier of the certain carrier type between the staging area and the first stock area includes moving the empty carrier of the certain carrier type only if the system move rate is less than a predetermined value.

16. The method of claim 10, further including associating each empty carrier type with a priority, wherein selectively moving the empty carrier of the certain carrier type between the first stock areas and the staging area includes moving the empty carrier of the certain carrier type based on the priority of the certain carrier type and the priorities of other carrier types.

17. The method of claim 10, further including calculating an empty move rate for the certain carrier type as the number of empty carriers of the certain carrier type moved in the system in a predetermined time period, wherein selectively moving the empty carrier of the certain carrier type between the staging area and the first stock area including moving the empty carrier of the certain carrier type only if the empty move rate for the certain carrier type is less than a predetermined value.

18. The method of claim 10, further including calculating a global empty move rate as the number of all empty carriers moved in the system in a predetermined time period, wherein selectively moving the empty carrier of the certain carrier type between the staging area and the first stock area includes moving the empty carrier of the certain carrier type only if the global empty move rate is less than a predetermined value.

19. An automated material handling system, comprising:

a plurality of wafer carriers including a plurality of empty carriers classified into at least two empty carrier types;

at least one stock area each including a plurality of bins for storing wafer carriers, wherein each stock area is associated with a predetermined quantity for each empty carrier type;

a control system coupled to a first one of the stock areas for computing an empty percentage for the first stock area for each carrier type, the empty percentage for a particular carrier type being the percentage of bins of the first one stock area which contain empty carriers of the particular type; and a transportation system responsive to the control system for selectively moving an empty carrier of a certain empty carrier type between a staging area and the first stock area based on a comparison of the empty percentage for the certain carrier type to the predetermined quantity of the first stock area for the certain carrier type.

20. A system for managing empty material carriers in an automated material handling system, the material handling system including a plurality of material carriers that include a plurality of empty material carriers and at least one stock area each including bins for storing material carriers, the system comprising:

means for classifying the empty material carriers into at least two empty carrier types;

means for associating each of the stock areas with at least one threshold for each empty carrier type;

means for computing an empty percentage for each empty carrier type for a first one of the stock areas, the empty percentage for a particular empty carrier type being the percentage of bins of the first one stock area which contain empty carriers of the particular type; and means for selectively moving an empty carrier of a certain empty carrier type between a staging area and the first stock area based on a comparison of the empty percentage for the certain carrier type for the first stock area to the at least one threshold of the first stock area for the certain empty carrier type.

* * * * *